United States Patent [19]

Lewis

[11] 4,272,742

[45] Jun. 9, 1981

[54] ACOUSTIC WAVE DEVICES WITH TEMPERATURE STABILIZATION

[75] Inventor: Meirion F. Lewis, Malvern, England

[73] Assignee: The Secretary of State for Defence in Her Britannic Majesty's Government of the United Kingdom of Great Britain and Northern Ireland, London, England

[21] Appl. No.: 77,703

[22] Filed: Sep. 21, 1979

[30] Foreign Application Priority Data

Sep. 22, 1978 [GB] United Kingdom ............. 37867/78

[51] Int. Cl.³ ................. H03H 9/42; H03H 9/68; H03H 9/25; H01L 41/18
[52] U.S. Cl. ................. 333/155; 331/107 A; 333/153; 333/193; 333/195
[58] Field of Search ............. 333/150–155, 333/193–196, 141–149, 187–192; 331/107 A, 162; 310/315, 346, 357, 365, 366, 313

[56] References Cited

U.S. PATENT DOCUMENTS

| 3,886,484 | 5/1975 | Dias et al. ............. 333/155 X |
| 3,950,713 | 4/1976 | Lewis ..................... 333/151 |
| 3,999,147 | 12/1976 | Otto et al. ............. 331/107 A |
| 4,159,435 | 6/1979 | Lewis ..................... 310/313 |
| 4,193,045 | 3/1980 | Houkawa et al. ........ 333/155 X |

FOREIGN PATENT DOCUMENTS 1188257 4/1970 United Kingdom .
1449841 9/1976 United Kingdom .

Primary Examiner—Marvin L. Nussbaum
Attorney, Agent, or Firm—Pollock, Vande Sande and Priddy

[57] ABSTRACT

An acoustic wave device comprises a substrate carrying two or more acoustic components aligned in different directions and electrically connected together in parallel. The phase slope of the acoustic components are similar but their temperature coefficients of delay are different whereby their resultant frequency response is compensated over a useful temperature range. The acoustic components may be delay line employing surface waves or surface skimming bulk waves, or one or two port resonators using surface waves.

15 Claims, 13 Drawing Figures

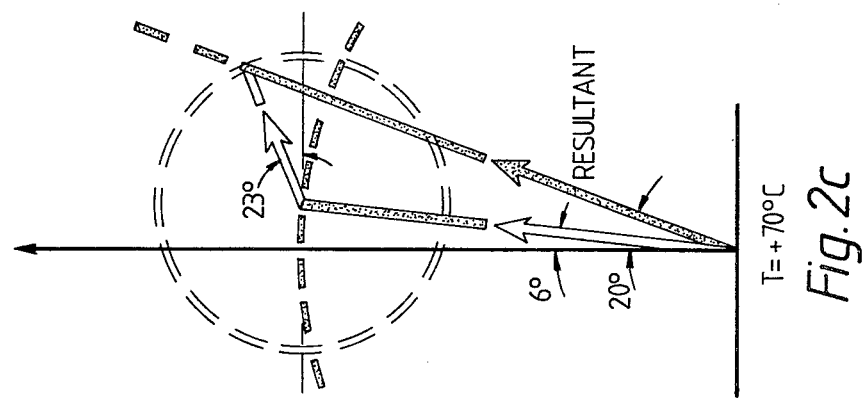
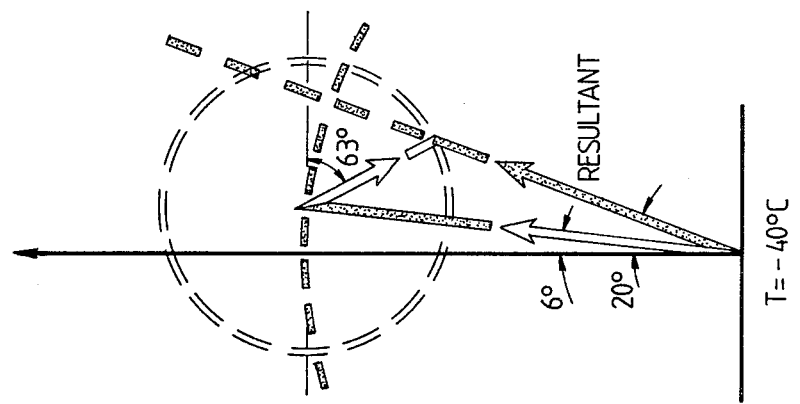
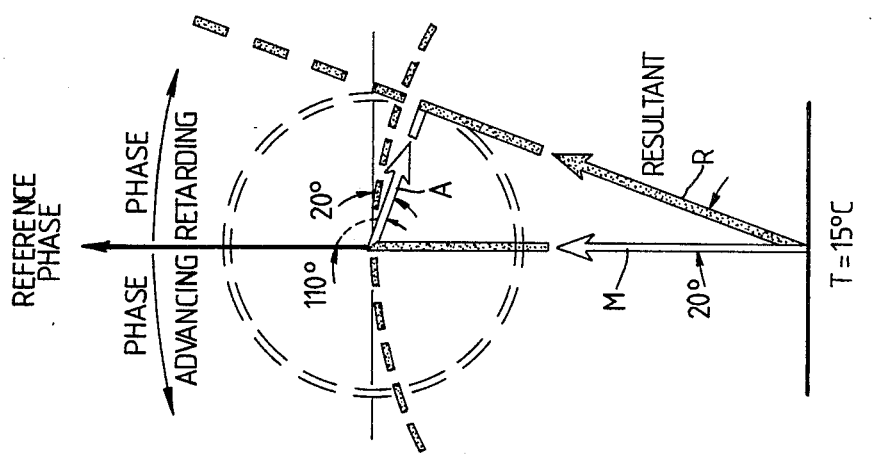

ACOUSTIC WAVE DEVICES WITH TEMPERATURE STABILIZATION

This invention relates to acoustic wave devices having temperature stabilization.

Acoustic wave devices may be surface acoustic wave (SAW) devices or surface skimming bulk acoustic wave (SSBW) devices. Such devices are used as delay lines, feed back elements to oscillators, filters, discriminators, etc.

In a typical SAW device acoustic waves are launched and received along the flat surface of a piezo electric substrate by two interdigital comb transducers, spaced apart along a surface acoustic wave track. A SSBW device is similar except that the acoustic wave is launched into the bulk of the substrate just below its surface.

The most common substrate material is quartz. It is cut along selected crystalline axes to provide a SAW device or SSBW device. Additionally the cut should provide a device whose characteristics do not change appreciably with substrate temperature.

One such cut for SAW devices is so called ST cut quartz. Another cut, described in my U.S. Pat. application No. 41,852, filed May 24, 1979 for "Surface Acoustic Wave Devices," has the flat surface rotated about the Y axis (a rotated X-cut) by plus or minus 41° to 47° from the Z plane and the track aligned 63° to 65° from the Y axis to make the track approximately perpendicular to a crystalline minor rhombohedral face. A family of cuts for SSBW devices is described in my U.S. Pat. No. 4,159,435 issued June 26, 1979 for "Acoustic Wave Devices Employing Surface Skimming Bulk Waves" in which the substrate flat surface is a rotated Y-cut quartz (rotated about the X axis) with the transducers arranged to propagate acoustic waves perpendicular to the X axis, the angle of the rotated Y-cut being in the range −60° to −45° and 30° to 45°.

Using carefully selected crystalline orientations, surface acoustic wave oscillators have been made in which the frequency of oscillation changes by about ±50 parts per million over the range −40° C. to +100° C. This compares with about ±10 ppm for conventional AT cut quartz bulk wave devices. One solution to the frequency stability versus temperature problem is to maintain the SAW device in a temperature controlled oven, but this is impractical for many applications.

An object of this invention is to provide an acoustic wave device that provides, at least in part, compensation for change in characteristics with temperature.

According to this invention an acoustic wave device comprises at least two acoustic components electrically connected in parallel, each component having a similar phase-slope, but with different transmission amplitudes and temperature coefficients of delay, and so arranged that the overall temperature-coefficient is compensated over a useful temperature range.

The acoustic components may for example be delay lines, or resonators, and may operate with surface acoustic waves, surface skimming bulk waves, or a combination of both.

The condition of similar phase-slopes (i.e. variation of phase with frequency at a given temperature) ensures that the temperature-compensation obtains over a band of frequencies. Since most acoustic devices are comprised of delay lines employing symmetrical transducers, the condition of similar phase-slopes is equivalent to the delay lines having the same path length, i.e. center-to-center separation of the input and output transducers measured in wavelengths at the center frequency. In practice it is permissable to employ marginally different pathlengths in order to set up the required phase differences between paths as discussed below.

It is not necessary that the delay lines be physically separated; for example SAW may be excited by interdigital transducers with discrete bends or with curvature to ensure acoustic excitation in different directions on one substrate.

The delay lines may employ any substrate material and may employ any acoustic wave, including SAW, SSBW, Bluestein-Gulyaer waves, etc. The only requirement is that some waves in some directions should have different temperature coefficients of delay. In practice it is useful to start with something stable, e.g. ST-quartz. The substrate may be piezo electric e.g. quartz, or non-piezo electric with piezo electric regions at the transducers.

In principle a high degree of compensation can be achieved by employing many tracks with different amplitudes and temperature coefficients. However in practice a useful degree of compensation can be achieved using just two or three tracks as described later.

The invention will now be described by way of example only with reference to the accompanying drawings of which:

FIG. 1 is a plan view of an oscillator with an acoustic wave device having two delay lines;

FIGS. 2a, b, c, are phasor diagrams at different temperatures for the device of FIG. 1;

Figure 4:
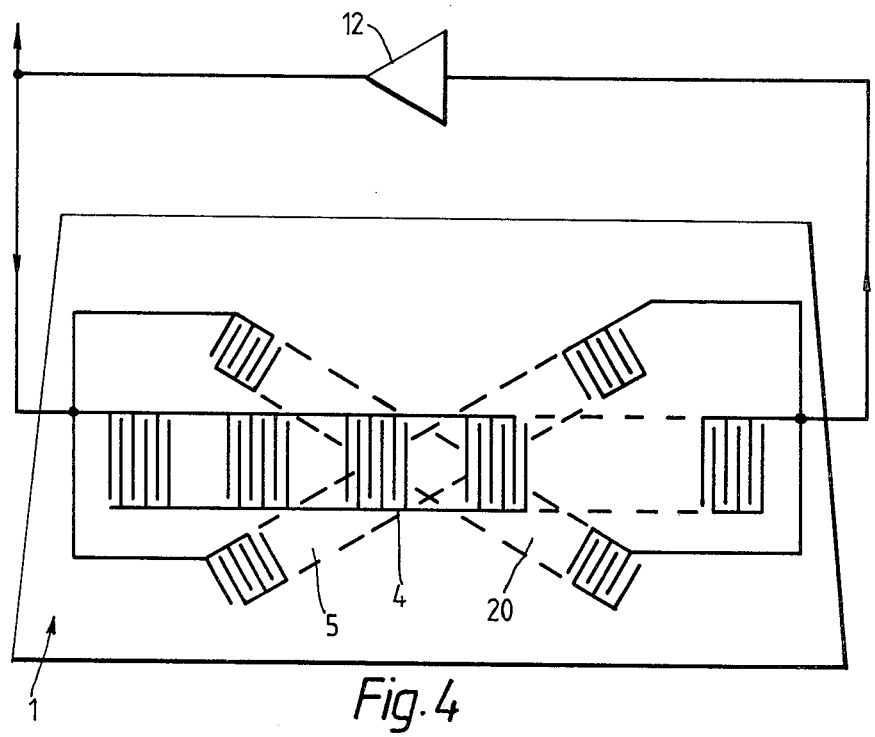
FIG. 4 is a plan of an acoustic wave device having three delay lines.
Figure 5C:
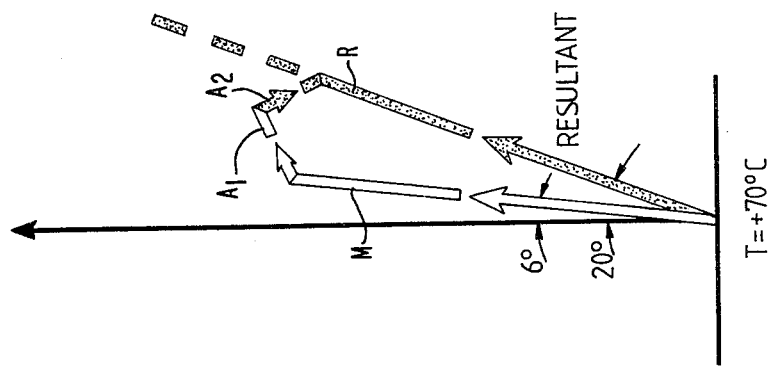
Figure 5B:
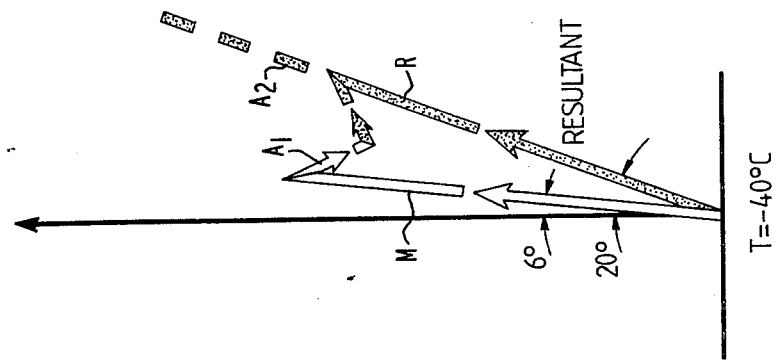
Figure 5A:
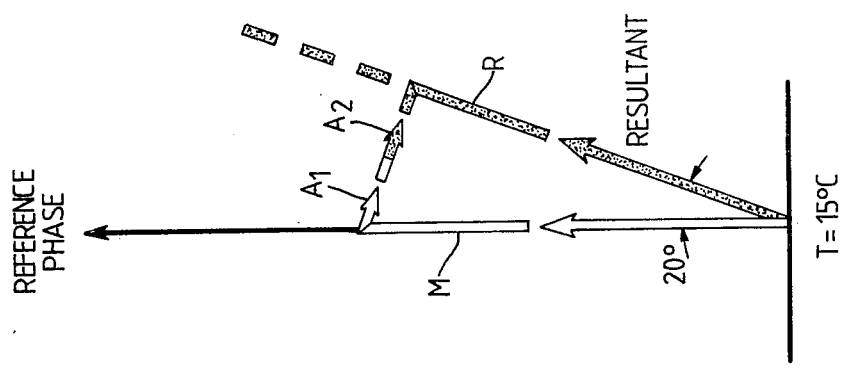
Figure 6B:
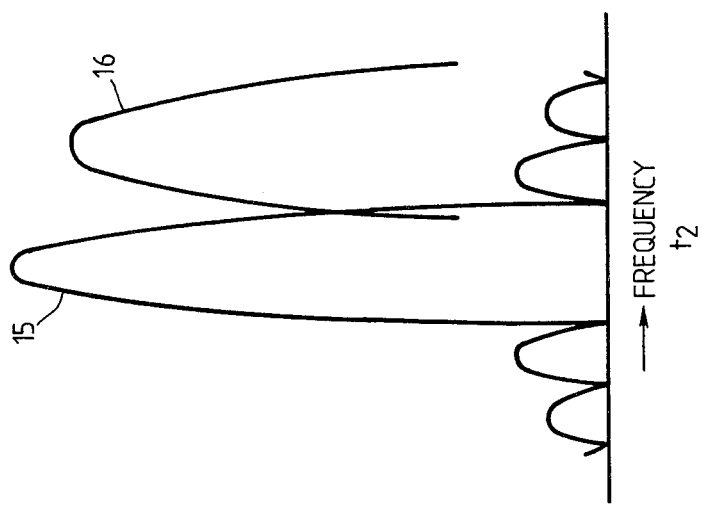
Figure 6A:
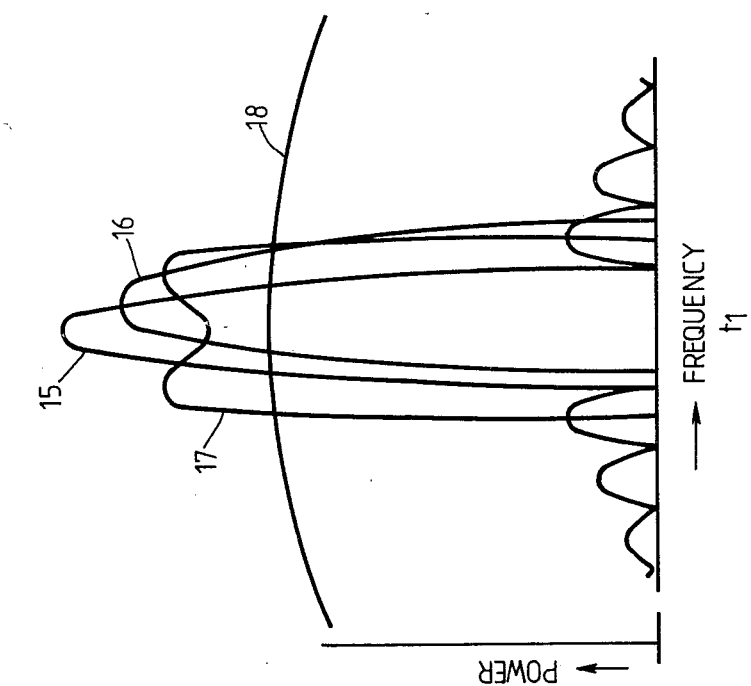
Figure 7:
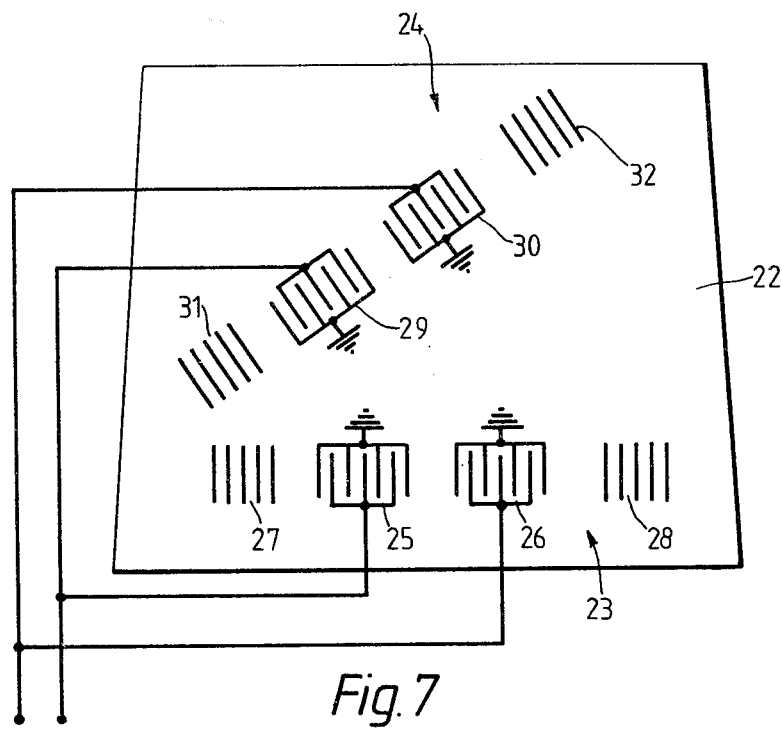

FIGS. 5a, b, c, are phasor diagrams at different temperatures for the device of FIG. 4 and FIGS. 6a, b, are frequency response curves of acoustic wave devices at different frequencies;

FIG. 7 is a plan view of a device using two two port resonators; and

Figure 8:
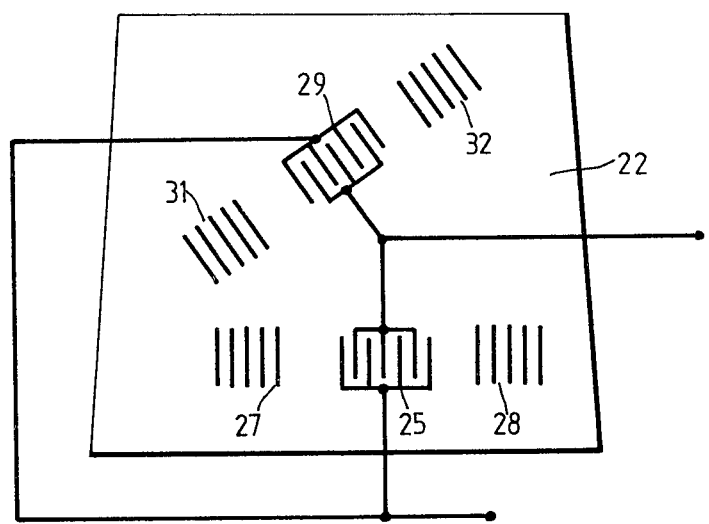

FIG. 8 is a plan view of a device using two single port resonators.

Figure 1:
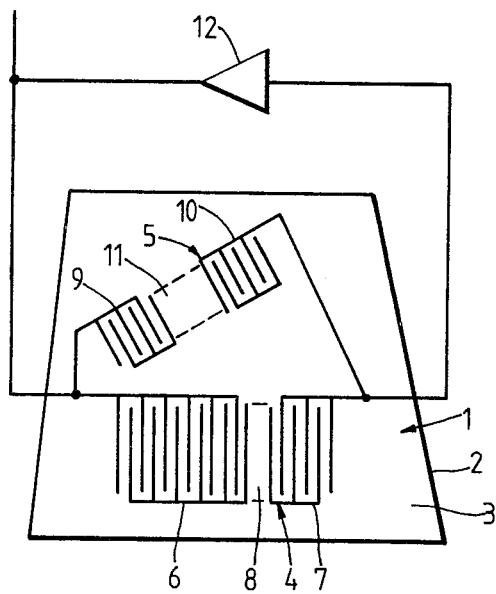

As shown in FIG. 1 an acoustic wave oscillator 1 comprises a quartz substrate 2 having a flat surface 3 carrying two acoustic wave delay lines, a main delay line 4 and an auxiliary delay line 5. The crystalline orientation of the flat surface 3 and the alignment of the delay lines 4, 5 determine whether surface, or surface skimming bulk waves are generated.

For a SAW device the substrate 2 may be ST cut quartz. The main delay line 4 is aligned to propagate surface acoustic waves along the X-axis. The auxiliary line 5 is aligned at 41° to the X-axis as will be described below. This particular angle (41°) was chosen because the SAW velocity is at a minimum (as in the X-axis) so the device is insensitive to misorientations in production.

Both delay lines 4, 5 are shown to be formed on one substrate 2, but, to reduce the area of quartz used, could be formed on separate substrates fixed to a common mount providing the delay lines were aligned on their respective pieces of quartz as in FIG. 1.

The main delay line 4 comprises an input transducer 6 and an output transducer 7 spaced apart along a main acoustic track 8 by an acoustic path length L measured transducer center-to-center for solid transducers as shown. For an oscillator to operate at a single mode then, as taught in my U.S. Pat. No. 3,950,713 issued Apr. 13, 1976 for "Acoustic Wave Devices," the length of the input transducer 6 equals the path length L, e.g. L=200 wavelengths.

In a similar manner the auxiliary delay line 5 comprises an input transducer 9 and an output transducer 10 along an auxiliary track 11.

The path length (measured in wavelengths at the center frequency) of the auxiliary delay line equals the pathlength L (again measured in wavelengths at the center frequency) except for about $\frac{1}{4} \lambda_o$, $\lambda_o$ being wavelength at center frequency, to provide a phase difference of about 90° (in the example of FIG. 2: 110°) between signals at the outputs of the delay lines. Alternatively the two path lengths (measured in wavelengths) could be the same and an external phase shift used. The external phase shifter may be adjustable.

The delay lines 4, 5 are connected in parallel with the output transducers 7, 10 connected to the input of an amplifier 12 whose output is connected to both input transducers 6, 9.

In operation the delay lines 4, 5 provide positive feedback to the amplifier 12 for the oscillator to operate at a frequency determined by the transducers 6, 7, 9, 10, finger spacing and path lengths L, L₁ of the delay lines 4, 5.

Figure 3:
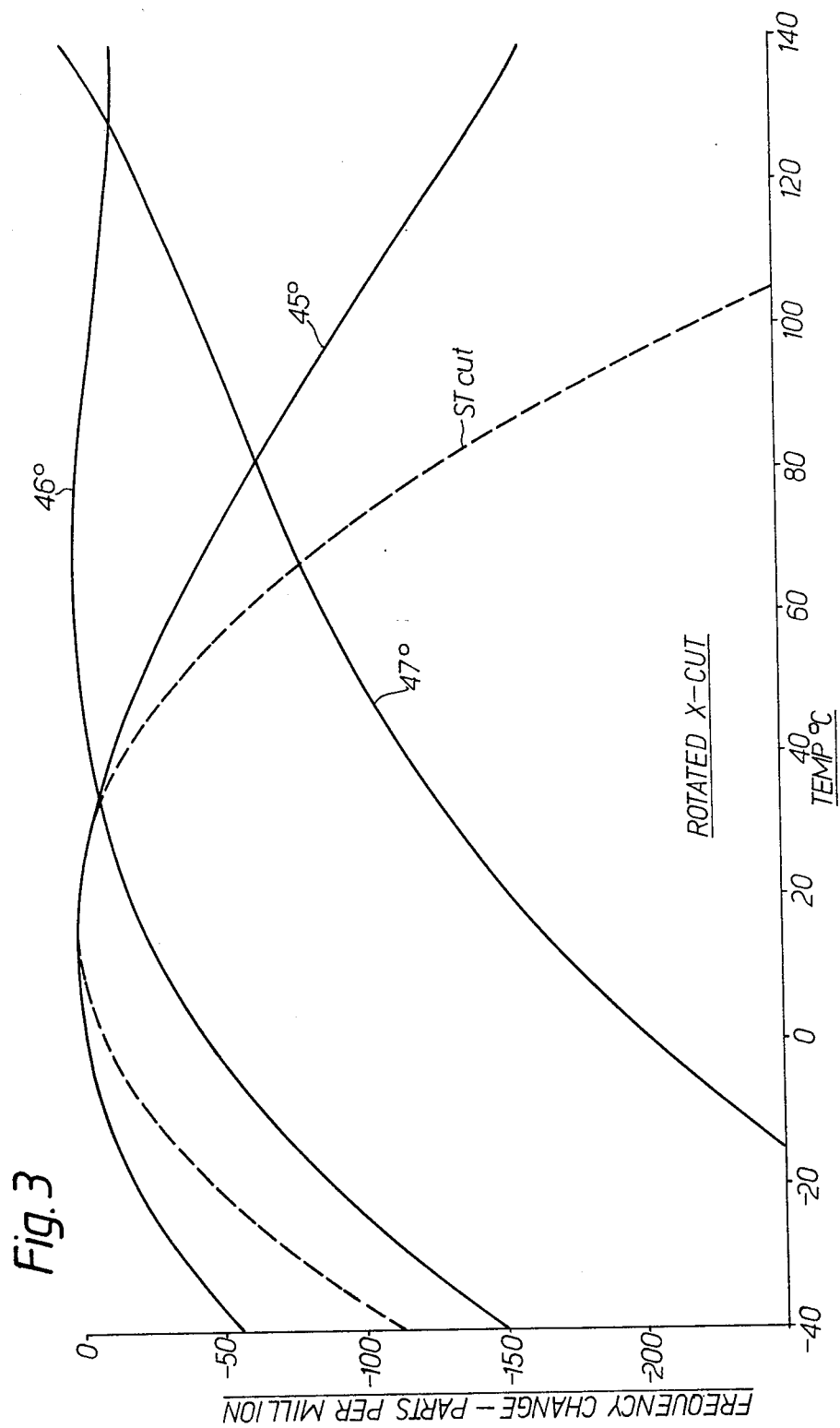
FIGS. 3 are frequency temperature curves for various quartz cuts used in acoustic wave device substrates.

FIG. 3 shows how the frequency of the oscillator would vary with temperature, if only the main delay line 4 were connected to the amplifier 12, for various orientations of quartz cuts. Both the ST cut and a 45° rotated X cut have parabolic curves.

FIG. 2 shows how the phase of signals from the delay lines 4, 5 changes with temperature. The phase measurements are obtained by connecting a single delay line to a constant frequency source and measuring the phase difference between signals applied to the delay line and that obtained from the delay line output transducer for various delay line temperatures.

Consider first the main delay line 4 with output M at zero phase at 15° C., FIG. 2a. Both decreasing the temperature to −40° C., FIG. 2b, and increasing it to 70° C., FIG. 2c, retards the phase. The reason for this can be seen from FIG. 3 i.e. 15° C. is about a maximum; either side of this the frequency falls.

Consider now the auxiliary delay line 5 having an output A which is retarded by 110° relative to the main delay line at 15° C., and which at 15° C. is perpendicular to the resultant R of both delay lines. As noted above this 110° phase difference may be achieved by the slightly different path lengths in the two delay lines.

The summed output R of the two delay lines 4, 5, the resultant, is about 20° retarded relative to the reference phase and remains constant as the phases of both delay lines 4, 5 change with temperature. Thus the summed output R of the delay lines 4, 5 is essentially independent of temperature, at least over the range −40° C. to 70° C., resulting in a stable oscillator frequency.

The alignment of the auxiliary delay line 5 is chosen so that, over a temperature range of interest, the phase-excursion of the auxiliary track does not exceed about ±60°. If greater excursions are allowed, the compensation becomes less effective.

The amplitude of the signal and the alignment of the auxiliary delay line 5 are chosen so that, the summed resultant R remains at a constant phase. An approximate formula relating the amplitude a of the auxiliary track (relative to unit amplitude in the main track) and the linear temperature coefficient of delay, β, of the auxiliary track to the parabolic temperature coefficient of delay, α, of the main track is $$\beta = \pm \sqrt{\frac{|\alpha|\sqrt{1-a^2}}{N\pi a}}$$

where N is the number of wavelengths in each path. Typical numbers (from a demonstration device) are α=3.10⁻⁹/°C.², β=−15.10⁻⁶/°C., N=200, a=¼. In practice a or β may be made slightly greater than indicated in this formula in order to optimize the compensation over an extended temperature range.

Another constraint on the two delay lines 4, 5 is their relative frequency response variation with temperature as shown in FIG. 6. Since the two delay lines 4, 5 are orientated differently, their frequency responses will change differently with temperature e.g. the main lobes 15, 16 in the typical sin x/x frequency response of the main and auxiliary lines 4, 5 respectively may no longer coincide enough to provide a summed output as temperature changes away from a set value, FIG. 6b. One solution to this is to employ a broad band auxiliary delay line curve 18 e.g. shorter transducers, than for the main delay line 4. Additionally or alternatively the auxiliary delay line 5 may use weighted transducers e.g. shown by curve 17. This may also provide a higher degree of temperature compensation i.e. over wider temperature range.

The frequency response for a 46° rotated X-cut quartz crystal shown in FIG. 3, does not show a parabolic curve. However an auxiliary delay line 5 may be used to compensate for the drop in frequency with lowering temperature as described above. To avoid compensation at higher temperatures the frequency response of the auxiliary transducer is slightly offset from that of the main track so that is moves out of coincidence with the main delay at these higher temperatures as shown schematically in FIG. 6b. Alternatively this result can be achieved by employing further auxiliary tracks.

FIG. 4 shows an alternative SAW device which employs two auxiliary delay lines 5, 20. The second delay line 20 is an addition to the device of FIG. 1 and is the same as the first auxiliary delay line 5 but aligned differently so that its phase variation with temperatures is of opposite sign to that of the first auxiliary delay line; additionally both auxiliary delay lines 5, 20 are arranged to cross the main delay line 4. This phase change is shown in FIGS. 5a–5c where at 15° C. the signals from both auxiliary delay lines are in phase. At −40° C. and 70° C. they are out of phase by equal amounts. The resultant R of the three delay lines summed outputs M, A₁, A₂ is essentially constant in phase and amplitude over the range −40° C. to 70° C.

Devices other than oscillators may be made using temperature compensated acoustic wave devices of this invention. For example the invention may be utilized in discriminators controlling voltage controlled oscillators as in my U.S. Pat. No. 3,921,093 issued Nov. 18, 1975 for "Acoustic Wave Oscillator," in chirp filters, resonators, band pass filters.

FIG. 7 shows a two port resonator having temperature stabilization in a manner similar to that of the delay lines of FIG. 1. A quartz substrate 22 carries a main resonator 23 arranged to propagate surface acoustic waves along the X axis of the ST cut, and an auxiliary resonator 24 arranged to propagate at 41° to the X axis. The main resonator 23 comprises two interdigital comb transducers 25, 26 arranged between two sets 27, 28 of reflecting strips. Likewise the auxiliary resonator 24 comprises two transducers 29, 30 arranged between two sets 31, 32 of reflecting strips.

The condition of ideally equal path lengths in the two delay lines of FIG. 1 does not apply to resonators. Instead the loaded Q for the two resonators is ideally equal, where Q is the quality factor determined by all loss mechanisms e.g. acoustic propagation on medium and electrical losses.

In operation the device operates to provide temperature stabilization with the resultant combined outputs having a relatively constant phase as the phase transfer characteristics of the two resonators vary with temperature e.g. as in FIG. 2.

In a modification two or more auxiliary resonators are used in a manner similar to that shown in FIG. 4 for the delay lines.

FIG. 8 shows use of single port resonators similar to the two port resonators of FIG. 7 with like elements given like reference numerals. A single-port resonator uses only one transducer as well known for conventional quartz crystal bulk wave resonator oscillators.

Operation in providing temperature stabilization is the same as for FIG. 7.

In an alternative construction the device of FIG. 8 uses two or more auxiliary resonators arranged as for the delay lines of FIG. 4.

Piezo electric substrates other than quartz may be used, for example the famil $Tl_3AX_4$ where A is V, Nb, or Ta, and X is S or Se; lead potassium niobate; lithium tantilate; lithium niobate. For substrates not having a zero temperature coefficient, e.g. lithium niobate, the invention may still be used to provide temperature compensation over a limited temperature range.

The range of temperatures for which compensation is provided by the illustrated examples may be a range, selected by the device service conditions, withing the range $-40°$ C. to $100°$ C.

I claim:

1. An acoustic wave device comprising at least two acoustic components each having transducer means for launching and receiving acoustic waves along an acoustic track in a substrate, said acoustic components having their respective transducer means electrically connected to one another in parallel and each having a similar phase slope but different temperature coefficients whereby the resultant overall frequency response of the device is compensated over a useful temperature range.

2. An acoustic wave device according to claim 1 wherein the acoustic components are aligned in different crystalline directions on a substrate.

3. An acoustic wave device according to claim 2 wherein the transducer means of said acoustic components are of at least two different sizes so that at least two different transmission amplitudes are obtained from the acoustic components.

4. An acoustic wave device according to claim 2 wherein the substrate is a piezo electric material.

5. An acoustic wave device according to claim 4 wherein the piezo electric substrate has a plurality of zero temperature coefficient alignments.

6. An acoustic wave device according to claim 2 wherein the acoustic components are arranged on a single substrate.

7. An acoustic wave device according to claim 2 wherein the acoustic components are delay lines each having an input transducer and an output transducer.

8. An acoustic wave device according to claim 6 wherein the delay lines have physically separate input transducers and output transducers.

9. An acoustic wave device according to claim 6 wherein one transducer from each delay line are arranged together as a single transducer having angled portions to launch or receive acoustic waves in at least two different directions.

10. An acoustic wave device according to claim 2 wherein the acoustic components are resonators each comprising at least one transducer arranged between two sets of reflectors.

11. An acoustic wave device according to claim 2 wherein each acoustic component is arranged on a separate substrate.

12. An acoustic wave device according to claim 4 wherein the acoustic components are surface wave devices.

13. An acoustic wave device according to claim 4 wherein the acoustic components are surface skimming bulk wave devices.

14. An acoustic wave device comprising a piezo electric substrate having a plurality of zero temperature coefficient crystalline orientations; a main acoustic wave delay line comprising an interdigital input transducer and an interdigital output transducer arranged on an acoustic track aligned in a first direction on the substrate; at least one auxiliary acoustic wave delay line comprising an interdigital input transducer and an interdigital output transducer arranged on an acoustic track aligned in a direction different from the first direction, said auxiliary delay line having a transmission amplitude smaller than that of the main delay line; means electrically connecting the delay lines in parallel, each delay line being aligned on a different zero temperature crystalline orientation and having a similar phase-slope but different temperature coefficients whereby the overall frequency response of said device is compensated over a useful temperature range.

15. The acoustic wave device of claim 14 wherein said device comprises two of said auxiliary acoustic wave delay lines arranged respectively on acoustic tracks aligned in directions different from one another and from the first direction.

* * * * *